US010809325B2

United States Patent
Braumann et al.

(10) Patent No.: US 10,809,325 B2
(45) Date of Patent: Oct. 20, 2020

(54) APPARATUS FOR QUICKLY CHANGING A SAMPLE IN AN NMR SPECTROMETER WITH A FLOW CELL

(71) Applicant: Bruker BioSpin GmbH, Rheinstetten (DE)

(72) Inventors: Ernst Ulrich Braumann, Ettlingen (DE); Martin Hofmann, Bad Herrenalb (DE)

(73) Assignee: BRUKER BIOSPIN GMBH, Rheinstetten (DE)

( * ) Notice: Subject to any disclaimer, the term of this patent is extended or adjusted under 35 U.S.C. 154(b) by 0 days.

(21) Appl. No.: 16/774,458

(22) Filed: Jan. 28, 2020

(65) Prior Publication Data

US 2020/0241088 A1  Jul. 30, 2020

(30) Foreign Application Priority Data

Jan. 29, 2019  (DE) .................. 10 2019 201 071

(51) Int. Cl.
*G01R 33/30* (2006.01)
*G01N 1/10* (2006.01)
*G01N 35/10* (2006.01)

(52) U.S. Cl.
CPC ............ *G01R 33/307* (2013.01); *G01N 1/10* (2013.01); *G01N 35/1097* (2013.01)

(58) Field of Classification Search
CPC ..... G01R 33/307; G01N 1/10; G01N 35/1097
See application file for complete search history.

(56) References Cited

U.S. PATENT DOCUMENTS

| 5,397,989 A * | 3/1995 | Spraul ................. G01R 33/307 |
| | | 324/318 |
| 5,705,928 A | 1/1998 | Haner et al. |

(Continued)

FOREIGN PATENT DOCUMENTS

| DE | 4234544 C2 | 9/1996 |
| DE | 102004029632 B4 | 6/2011 |

(Continued)

OTHER PUBLICATIONS

D. Will et al.: "Hydraulik Grundlagen, Komponenten, Schaltungen" (2011).

(Continued)

*Primary Examiner* — Dixomara Vargas
(74) *Attorney, Agent, or Firm* — Edell, Shapiro & Finnan, LLC

(57) ABSTRACT

A system including an NMR spectrometer (1) with a flow cell (2) analyzing a first liquid test sample (P1), a distributing device (3) with a multi-way valve, plural assemblies interconnected via fluid lines through the distributing device, a cannula (5) taking test samples from a storage vessel (5a), a sample loop (6) temporarily storing a further test sample (P2), and a pump device (7) pumping liquid (S) into the system. The valve arrangement a) decouples the sample loop with the temporarily stored further test sample and, simultaneously, b) decouples the flow cell with the first test sample from all fluid lines to the distributing device; and c) connects the cannula to the pump device for a simultaneous purging step or to the flow cell for removing the first test sample into a receiving vessel (5b; 5c) or to the sample loop for receiving a subsequent test sample.

15 Claims, 10 Drawing Sheets

(56) References Cited

U.S. PATENT DOCUMENTS

| | | | |
|---|---|---|---|
| 6,380,737 B1 | 4/2002 | Myles | |
| 6,415,648 B1* | 7/2002 | Peeters | G01V 1/50 |
| | | | 166/250.02 |
| 7,250,767 B2 | 7/2007 | Hofmann et al. | |
| 7,275,682 B2* | 10/2007 | Excoffier | B01L 3/5457 |
| | | | 235/375 |
| 7,372,274 B2* | 5/2008 | Ardenkjaer-Larsen | |
| | | | G01R 33/282 |
| | | | 324/307 |
| 8,624,599 B2* | 1/2014 | Kamlowski | G01R 33/307 |
| | | | 324/321 |
| 9,524,856 B2* | 12/2016 | Hilliard | G01N 1/2226 |
| 10,145,810 B2* | 12/2018 | Wang | G01N 24/081 |
| 2002/0050821 A1 | 5/2002 | Iwata | |
| 2003/0103872 A1 | 6/2003 | Maier et al. | |
| 2004/0066193 A1* | 4/2004 | Ardenkjaer-Larsen | |
| | | | G01R 33/282 |
| | | | 324/309 |
| 2006/0213964 A1* | 9/2006 | Excoffier | G01N 35/00732 |
| | | | 235/375 |
| 2006/0283945 A1* | 12/2006 | Excoffier | B01L 3/5457 |
| | | | 235/439 |
| 2007/0266779 A1* | 11/2007 | Hofmann | G01R 33/307 |
| | | | 73/64.56 |
| 2011/0285396 A1 | 11/2011 | Hofmann et al. | |
| 2015/0089998 A1* | 4/2015 | Tipler | G01N 30/66 |
| | | | 73/23.42 |
| 2016/0290942 A1* | 10/2016 | Wang | G01N 24/081 |
| 2016/0336158 A1* | 11/2016 | Kovarik | H01J 49/0431 |
| 2017/0131245 A1* | 5/2017 | Stoll | G01N 30/32 |
| 2019/0136988 A1 | 5/2019 | Mizuno et al. | |
| 2019/0355565 A1* | 11/2019 | Sarrafzadeh | H01J 27/20 |

FOREIGN PATENT DOCUMENTS

| | | |
|---|---|---|
| DE | 102018127147 A1 | 5/2019 |
| EP | 0592816 B1 | 9/1993 |

OTHER PUBLICATIONS

German Office Action dated Dec. 13, 2019, and English translation thereof.

\* cited by examiner

APPARATUS FOR QUICKLY CHANGING A SAMPLE IN AN NMR SPECTROMETER WITH A FLOW CELL

CROSS REFERENCE TO RELATED APPLICATIONS

This application claims foreign priority under 35 U.S.C. § 119(a)-(d) to German Application No. 10 2019 201 071.7 filed on Jan. 29, 2019, the entire contents of which are hereby incorporated into the present application by reference.

FIELD OF INVENTION

The invention relates to a system comprising an NMR spectrometer with a flow cell with two ends for carrying out an analytic NMR measurement on a first liquid test sample, a distributing device, which comprises a valve arrangement with at least one multi-way valve, and a plurality of assemblies which are connectable to one another in fluid-conducting fashion or separable from one another via fluid lines by way of the distributing device, wherein at least the following assemblies are present in the system: the flow cell in the NMR spectrometer, a cannula for taking a liquid test sample from a storage vessel, a sample loop with two ends for an intermittent temporary storage of a further liquid test sample, and a pump device for pumping system liquid into the system.

BACKGROUND

Such a system with the aforementioned components is known from U.S. Pat. No. 7,250,767 A or DE 10 2004 029 632 B4 (=citation [1]).

In general, the present invention relates to the field of analytic measurements using magnetic resonance spectroscopy. NMR (=nuclear magnetic resonance) spectroscopy is a widespread measurement process, with which chemical compounds can be analyzed. In the case of liquid NMR spectroscopy, a liquid sample to be measured is usually placed into a sample tube in a sample probe, which is measured in the NMR spectrometer.

However, the time factor between taking a sample and the (NMR) measurement plays a significant role during a sample transfer. For users with a large number of samples, who wish to carry out a fast and cost-effective classification of the samples using NMR, the technique of the direct sample transfer in a flow cell is the most cost-effective process for bringing the sample from a storage vessel into the NMR spectrometer. This is because time and costs are saved by the omission of the conventional NMR sample tubes.

However, on account of the more complicated pretreatment and posttreatment of the samples, preparation and transfer times of less than 2 minutes were previously only achieved with disproportionately great outlay. Moreover, the quality of the spectra is often adversely affected in the process, inter alia due to inadequate cleaning procedures.

By contrast, there is a need in industry, however, of measuring and verifying several thousand samples in the shortest possible time.

U.S. Pat. No. 5,397,989 A EP 0 592 816 B1 DE 42 34 544 C2 (=citation [2]) describes a directly coupled sample interchange system for liquid NMR spectroscopy. It comprises a dual-cell flow sample head with a sample transfer via an XYZ-liquid handler with completely separated circuits. Actions in parallel such as intermediate storage of the sample and simultaneous washing of the sample head or drying with gas are not possible. Therefore, this structure only allows sequential work, i.e. pulling the sample into the sample loop and subsequently switching a valve for forwarding the sample into the NMR spectrometer. This is the first commercial version of liquid NMR and, accordingly, only has a reduced functionality. Especially washing and cleaning the entire flow path—in particular, in the correct direction for avoiding contamination—are not possible therewith. However, the transfer lines can already be emptied using pressurized gas.

U.S. Pat. No. 5,705,928 A (=citation [3]) relates to a flow cell which conveys a liquid sample to be analyzed through an analysis instrument using pressurized gas. The apparatus only operates with a regulated gas pressure for transfer and positioning of the sample in a flow head.

The apparatus described in U.S. Pat. No. 6,380,737 A (=citation [4]) is similar to the structure and the system according to citation [2]. A sequential transfer is described, e.g., from a multiwell plate using a transfer system and a simple bypass valve, in which a plurality of samples in the transfer line are initially pumped into a waiting loop and then output to the spectrometer. Washing between the samples is therefore not possible.

US 2011/0285396 A1 (=citation [5]) describes a direct injection from a reaction container and relates to a flow cell for para hydrogen induced polarization (="PHIP"). Inter alia, a stop-flow valve is shown, which produces two independent, completely separated circuits and therefore has very similar restrictions as, for instance, the apparatus according to citation [2]. One circuit is the flow head, in which the measurement is carried out; the other circuit is the reactor, in which the next PHIP reaction can be prepared in parallel. The transfer is brought about by exerting positive pressure (gas pressure) on the reaction vessel. Cleaning the sample head is not possible when a new sample is in the reaction vessel. The old sample is either displaced or replaced by the new sample, or the washing process must be carried out before the new sample lands in the reactor.

Citation [1] cited at the outset finally describes an apparatus for supplying a liquid sample into an NMR spectrometer for the purposes of measuring an NMR spectrum of the liquid sample, wherein the liquid sample is injected into a supply line using a so-called "injection port". The liquid samples in the supply line and further liquids are separated from one another, and separated by gas bubbles, so that no mixing occurs. This is achieved by a valve arrangement which can be connected on the output side to the supply line. The further liquids and gas are supplied to the valve arrangement via supply lines, wherein the supply of each liquid and each gas is implemented by way of a dedicated line. Temporally tuned switching of the valve arrangement can produce a desired sequence of sample segments, gas bubbles and further liquid segments in the supply line, said sequence being supplied to the NMR spectrometer. This process was found to be relatively slow for screening with a high sample throughput. Simultaneously drawing up of a further sample during an NMR measurement of a first sample already situated in the spectrometer progressing simultaneously therewith is not possible.

However, the following points are disadvantageous in all previously known generic apparatuses:

there is a relatively large time outlay for aspirating and transferring a sample into the measuring cell since parallel operation is not possible;

washing functions are time-limited, or not present at all; at least there is no washing function that progresses in parallel with the measurement.

Finally, none of the known generic arrangements offer the option of cleaning the capillary to the cannula both with system liquid and with a gas flow in the case of a filled NMR measuring cell (first test sample P1) and a filled sample loop (further test sample P2) and of preparing said capillary to the cannula for recovering the measured first liquid test sample.

None of the known generic arrangements have a pump integrated, said pump—depending on the valve position—being able to operate so many independent circuits and, additionally, both liquid ports of the NMR measuring cell:
pump—sample cannula
pump—loop—sample cannula
pump—loop—NMR measuring cell (bottom)
pump—NMR measuring cell (top)
gas—measuring cell (top)
gas—sample cannula

SUMMARY

By contrast, one object of the present invention is is to provide an operational process of taking a sample, transferring a sample, carrying out an NMR measurement, and cleaning the measuring cell as a preparation for the next sample transfer, all within a timeframe of less than 1 minute and using unobtrusive, easily procurable technical solutions in a system of the type set forth at the outset. In particular, it is a related object to use the idle time during the NMR measurement to receive a further liquid test sample and/or to clean the transport capillaries.

It is yet another object to design the procedure to be software-controlled, largely automatable and highly reproducible. Finally, the system should have a structure that is as spatially compact as possible but nevertheless admits a multiplicity of design options for the different operating phases and method processes.

These objects are achieved by the present invention, according to one formulation, by virtue of the valve arrangement of the distributing device being embodied such that
a) the sample loop with the temporarily stored further liquid test sample is decouplable from all fluid lines to and from the distributing device and, simultaneously,
b) the flow cell with the first liquid test sample is decouplable from all fluid lines from and to the distributing device; and that
c) the cannula is connectable to the pump device for a simultaneous purging step or connectable to the flow cell for removing the first test sample into a receiving vessel or connectable to the sample loop for receiving a subsequent further test sample.

The valve configuration over the system according to the invention, which is significantly improved over the prior art, allows a multiplicity of method steps that are able to be carried out in parallel, and so it is possible to measure samples with a time-saving high throughput. In particular, decoupling the measuring cell from the distributing device allows the steps specified under c) to be carried out. Hence, there is no dead time due to the measurement and significantly more samples can be throughput per unit time than with the options known from the prior art.

In particular, the aforementioned objects are achieved by a specific valve combination and a virtually closed circuit for taking, transferring and returning the sample, in which there are no longer any external transition stations, such as the injection port.

In order to restrict the entire cycle to less than one minute, a new sample can already be parked in the sample loop during the current NMR measurement. Moreover, the measuring cell and the entire flow path can be cleaned and emptied with pressurized gas when the sample is parked in order to minimize, preferably entirely avoid, a possible contamination of the affected assemblies with the preceding sample. Additionally, in the case of a parked further liquid test sample P2 and a first test sample P1 in the NMR measuring cell, the flow path to the sample cannula can be cleaned and/or emptied with pressurized gas in order to minimize, preferably entirely avoid, a possible contamination of the affected assemblies with the preceding sample.

The actual automation and an open-loop and closed-loop control then ultimately facilitates an open-loop and closed-loop control apparatus for electrical actuation of the pump and pressurized gas devices and for electrical actuation of the valve arrangement.

As a result of using one and the same capillary/flow path/measuring cell for the sample transfer, a slight dilution of the liquid test sample (<1%) cannot be completely precluded as a matter of principle. However, this effect can be reduced to a minimum by way of a slight excess of sample liquid.

In particular, the following advantages can be obtained with the present invention:

A direct injection system in an NMR flow cell in a closed circuit, in which there no longer is any external transition station, such as the injection port, allows work cycles including sample preparation (approximately 25 s), sample transfer (approximately 15 s), NMR measurement (approximately 35 s) and cleaning of the flow path, which facilitate a cycle of less than 1 minute as a result of operating steps running in parallel.

As a result of the sample loop that is decoupled at a specific multi-path valve, the sample loop can be cleaned—parallel in time with a currently running NMR measurement—and filled with a new sample without having an adverse effect on the running NMR measurement therewith.

Moreover, the measuring cell and the entire flow path to the NMR measuring cell and the sample needle can be cleaned or emptied/dried with gas in the case of a parked sample in order to minimize or entirely avoid a possible contamination with the preceding sample.

Additionally, the flow path to the sample cannula can be cleaned and emptied with pressurized gas in the case of a parked further test sample P2 and a first test sample P1 in the NMR measuring cell in order to minimize or preferably entirely avoid a possible contamination of the relevant assembly with the preceding test sample P2. The sample cannula is prepared for recovering the measured first liquid test sample P1 as a result thereof.

As a result of a suitable arrangement of the ports, it is possible to fill the measuring cell from below such that disturbing air bubbles can escape to the top.

Further, the measuring cell can be purged from above with system liquid. Only small amounts of system liquid are required to obtain maximum success when cleaning the measuring cell with system liquid from above. These small amounts are optionally also introduced multiple times, alternately with the gas flow for emptying the measuring cell by blowing, and, as a result thereof, facilitate optimum result, even in the case of only little time outlay.

Moreover, it is possible to purge the measuring cell including the flow path from above with gas and empty the capillaries. As a result of purging with gas, the entire flow path for the sample transfer is emptied. As a result, there is less mixing with possibly remaining system liquid droplets during the subsequent transfer of the liquid test samples into the NMR measuring cell. Furthermore, the flow cell can be filled at higher flow rates through an emptied transfer capillary that is only filled with gas since gas generates substantially less back pressure in the capillaries than a liquid.

The arrangement of the ports renders it possible to capture the measured sample from the measuring cell in a vessel provided to this end and to recover said sample. Alternatively, a simple disposal vessel may also be filled with the old sample liquid that is no longer required—in the case of less "precious" samples.

Since the liquid NMR system is integrated to an XYZ liquid handler, it is also possible to carry out more complex preparations when necessary, such as, e.g., adding a locking substance and/or mixing the sample prior to the transfer.

EXEMPLARY EMBODIMENTS

A class of embodiments of the system according to the invention is particularly preferred, said class being distinguished in that the pump device is connectable in fluid-conducting fashion to one end of the sample loop for conveying the further liquid test sample temporarily stored in the sample loop into the flow cell of the NMR spectrometer and for purging the sample loop with system liquid, while the other end of the sample loop is connectable to one end of the flow cell.

The multi-way valve can be switched in such a way that the solvent pump is connectable to the supply line of the flow cell via the sample loop; at the same time, the emptying line can then be connected to the sample receiving line. This allows a direct transfer of the further sample to be carried out while the first sample is emptied at the same time, without a further purging step being carried out. Thus, this can obtain an even faster sample throughput.

In this fast-throughput procedure, it is moreover advantageous if the sample receiving line "draws some air" at the end of the sample reception such that there is no droplet formation at the cannula tip. This is because these droplets could fall on the working area and, in the worst case, contaminate a further sample as well.

For the purposes of recovering or disposing of already measured sample liquid, the cannula is connectable in fluid-conducting fashion to a corresponding receiving vessel for receiving the first liquid test sample from the flow cell of the NMR spectrometer in embodiments of the invention.

In another important class of embodiments of the system according to the invention, a pressurized gas supply for introducing pressurized gas into the system is present as a further assembly. The pressurized gas supply is connectable in fluid-conducting fashion to the flow cell of the NMR spectrometer for the purposes of ejecting the first liquid test sample P1 by purging. At the same time, the other end of the flow cell is simultaneously connected in fluid-conducting fashion to a receiving vessel for receiving the first liquid test sample P1 such that the first liquid test sample P1—which is no longer required in the spectrometer after the measurement has being carried out—is blown out into the receiving vessel (either a waste container or a recovery vessel) by the pressurized gas supply.

Developments of this class of embodiments in which the valve arrangement of the distributing device is embodied in such a way that the gas for emptying the flow cell by purging can be guided into the flow cell from above are particularly preferred. Using this, the measuring cell can be emptied from above with the pressurized gas such that there is no mixing/diluting of purging solution with the first test sample P1. Moreover, filling with the subsequent further test sample P2 can be implemented more quickly since the flow cell is filled against the gas pressure as a result thereof and not against an elevated liquid pressure, which may be present in the line.

A further, very particularly advantageous class of configurations of the invention is characterized in that the pump device is connectable in fluid-conducting fashion to one of the two ends of the flow cell for the purposes of purging the flow cell with system liquid. At the same time, the other end of the flow cell is connected in fluid-conducting fashion to a receiving vessel for receiving the system liquid following the purging of the flow cell. This simultaneous purging step is possible, in particular, because the sample loop can be closed and separated from the remaining flow path. This is not realizable in the prior art.

Developments of this class of embodiments in which the sample loop is completely decouplable from the distributing device during the purging of the flow cell with system liquid such that the further liquid test sample P2 "temporarily parked" in said sample loop is not influenced by the cleaning process are particularly preferred.

Further advantageous embodiments of the invention are characterized in that the valve arrangement of the distributing device is configured to introduce the further liquid test sample P2 from the sample loop into the flow cell from below. This is important for the precise sample feed so that the measuring cell from which the first test sample P1 has been emptied can be filled without bubbles with a further liquid test sample P2.

In a further preferred embodiment of the system according to the invention, the valve arrangement of the distributing device is configured to introduce the system liquid into the flow cell from above for cleaning purposes.

In a particularly preferred configuration, the system according to the invention should be configured in such a way that the pump can be connected from below for the sample transfer into the flow cell, but from above for purging. Consequently, the pump can be connected to different ends of the flow cell, depending on the current task.

A further class of advantageous embodiments is characterized in that the pump device is electrically actuatable for pumping system liquid and/or liquid test sample and said pump device preferably only comprises a single pump. Consequently, such a particularly simple system can be offered more cost-effectively. Although "on flow" and "stopped flow" modes are also possible, the transfer time to the measuring cell will take a substantially longer time since the flow rates of the pump cannot be set arbitrarily high in this case. Higher flows result in a high system pressure and a worse measurement result in the NMR magnet. A significant NMR signal reduction is already visible in the case of flows above 3 ml/min. Therefore, the system is subject to certain constraints.

Preferably, the pump device and the valve device as well as the entire liquid path of the measurement liquid are designed in such a way that they can be operated with the flow rate of between 0.1 ml/min and 1000 ml/min, preferably between 1 ml/min and 20 ml/min.

Embodiments of the system according to the invention in which an open-loop and closed-loop control apparatus is present for electrical actuation of the pump device and for electrical actuation of the valve device are very particularly preferred. Said open-loop and closed-loop control apparatus is preferably configured in such a way that it facilitates a time-controlled and/or a volume-controlled closed-loop control of the valve device and/or of the pump device, in particular an independent flow and volume control.

Further advantageous embodiments are distinguished by virtue of the parts of the pump device and the valve device that are wetted by measurement liquid and the entire liquid path of the measurement liquid being constructed from chemically inert materials, in particular glass, PTFE (=polytetrafluoroethylene), PCTFE (=polychlorotrifluoroethylene), ETFE (=ethylene tetrafluoroethylene), so that a service life of the relevant components that is as long as possible is ensured, independently of the chemical composition of the test samples used.

A further preferred embodiment of the system according to the invention is distinguished by virtue of the pump device and the valve device and the entire liquid path of the measurement liquid being constructed from materials that are usable in an operating temperature range from −50° C. to +150° C., preferably from −20° C. to +100° C.

The scope of the present invention also includes a particularly compact distributing device for the system according to the invention, which distributing device is constructed from a rotation valve with nine ports and one 4/2-way rotation valve.

However, alternatively, the distributing device may comprise a six 3/2-way solenoid valves and a corresponding manifold, more particularly be constructed from these components.

Moreover, the scope of the present invention also includes a method for operating a system according to the invention of the above-described type, said method being characterized by the following steps:

(a) the sample loop with the temporarily stored further liquid test sample P2 is decoupled from all fluid lines to and from the distributing device; wherein
(b) the pressurized gas supply for ejecting the first liquid test sample P1 out of the flow cell of the NMR spectrometer by blowing is connected in fluid-conducting fashion to one end of the flow cell, with a simultaneously decoupled sample loop and decoupled pump device, while the other end of the flow cell is connected in fluid-conducting fashion to a receiving vessel at the same time for the purposes of receiving the first liquid test sample P1 such that the pressurized gas supply blows the first liquid test sample P1 into the receiving vessel; and wherein
(c) the pump device is connected in fluid-conducting fashion to one end of the flow cell for the purposes of purging the flow cell with system liquid, with a simultaneously decoupled sample loop and decoupled pressurized gas supply, while at the other end the flow cell is connected at the same time in fluid-conducting fashion to a receiving vessel for receiving the first liquid test sample P1 after the purging of the flow cell.

In the case of a closed position of the fluids in the loop of supply line, emptying line and flow cell, this can be used to carry out the NMR measurement with the first sample P1 and, at the same time, receive the next further test sample P2 in the loop, and the sample receiving line can be purged.

An advantageous development of this method is distinguished in that, for the purposes of drying the flow cell and the purged fluid lines after the purging step (c) has been carried out, a further blowing step (b') is carried out by virtue of the pressurized gas supply being connected to one end of the flow cell for emptying the flow cell by blowing again, with a simultaneously decoupled sample loop and pump device, while the other end of the flow cell is connected at the same time in fluid-conducting fashion to a receiving vessel for the purposes of receiving the fluid ejected by the blowing.

In this mode of operation, a further purging step (c') for cleaning the cannula for the purposes of subsequently taking a third liquid test sample from the storage vessel again with a simultaneously decoupled sample loop and decoupled flow cell can also be carried out within an NMR measurement cycle after carrying out for the first time the blowing step (b) of the further test sample P2 and before and/or immediately after carrying out the purging step (c), wherein the pump device is connected in fluid-conducting fashion to a receiving vessel during this further purging step (c').

Moreover, in a development of this method variant, the further purging step (c') for cleaning the cannula can already be carried out before the blowing step (b) is carried out for the first time, wherein the other end of the flow cell is then connected in fluid-conducting fashion during this blowing step (b) to a special receiving vessel for a conserving recovery of the first liquid test sample P1 that was ejected from the flow cell by the blowing.

Optionally, it is also possible to provide a valve position with which the pressurized air is relaxed in the emptying line following the emptying of the flow cell. This simplifies refilling of the measuring cell.

A particularly simple, alternative method variant is characterized by the following steps:

(d) the pump device is connected in fluid-conducting fashion to one end of the sample loop for the purposes of conveying the further liquid test sample P2 temporarily stored in the sample loop into the flow cell of the NMR spectrometer and for purging the sample loop with system liquid, while the other end of the sample loop is connected to one end of the flow cell, the other end of said flow cell being connected at the same time in fluid-conducting fashion to a receiving vessel for receiving the first liquid test sample.

Finally, a development of the above-described method variants according to the invention, which is distinguished by virtue of the volumetric amount of the further liquid test sample being dimensioned in such a way that the void volume of the sample loop is only partly filled with the liquid test sample (P1, P2, . . . ) and by virtue of the liquid test sample, when transferred into the flow cell, being taken from precisely that end of the sample loop from which it was previously filled into the sample loop for temporary storage purposes, is also advantageous.

Such partial filling of the sample loop is not mandatory for the general procedure. The sample loop could also be designed in such a way that it exactly corresponds to the necessary amount of sample and said sample loop could be slightly overfilled. Then, the direction from which the liquid test sample is pumped out of the sample loop would be irrelevant. However, aspirating an exceed of liquid also means more time outlay, which is intended to be kept as low as possible in this application (complete cycle <60 s).

In addition to the risk of contaminating the pump with excess remains of the sample when the sample loop is overfilled, flexibility is also lost. In the case of using a flow measuring cell with a different internal volume, the sample loop would also have to be adapted to the new volume at the same time.

Therefore, a sample loop with a relatively larger internal volume, which is only filled in part with the minimum amount of sample necessary, appears more suitable. However, this also requires the entrance into the sample loop when aspirating the sample also to be the exit when filling the flow measuring cell in order to ensure a defined liquid test sample front and hence always ensure the same transfer volume for exactly positioning the sample in the measuring cell.

Therefore, the sample loop is preferably only partly filled with a defined amount. Then, it is important for exact positioning of the sample in the flow cell that the sample is pushed out through the same sample loop connection through which it was previously sucked in. This always guarantees an identical starting point of the sample and also an identical endpoint in the measuring cell. Incidentally, a similar procedure is also used in chromatography in the case of partly filled sample loops.

Further advantages of the invention emerge from the description and the drawings. Likewise, according to the invention, the features specified above and the features yet to be explained in more detail can find use respectively on their own or together in any combination. The shown and described embodiments should not be interpreted as a comprehensive list; instead, they have an exemplary character for explaining the invention.

BRIEF DESCRIPTION OF THE DRAWINGS

The invention is illustrated in the drawing and explained in more detail on the basis of exemplary embodiments. In detail.

DETAILED DESCRIPTION

Figure 1:
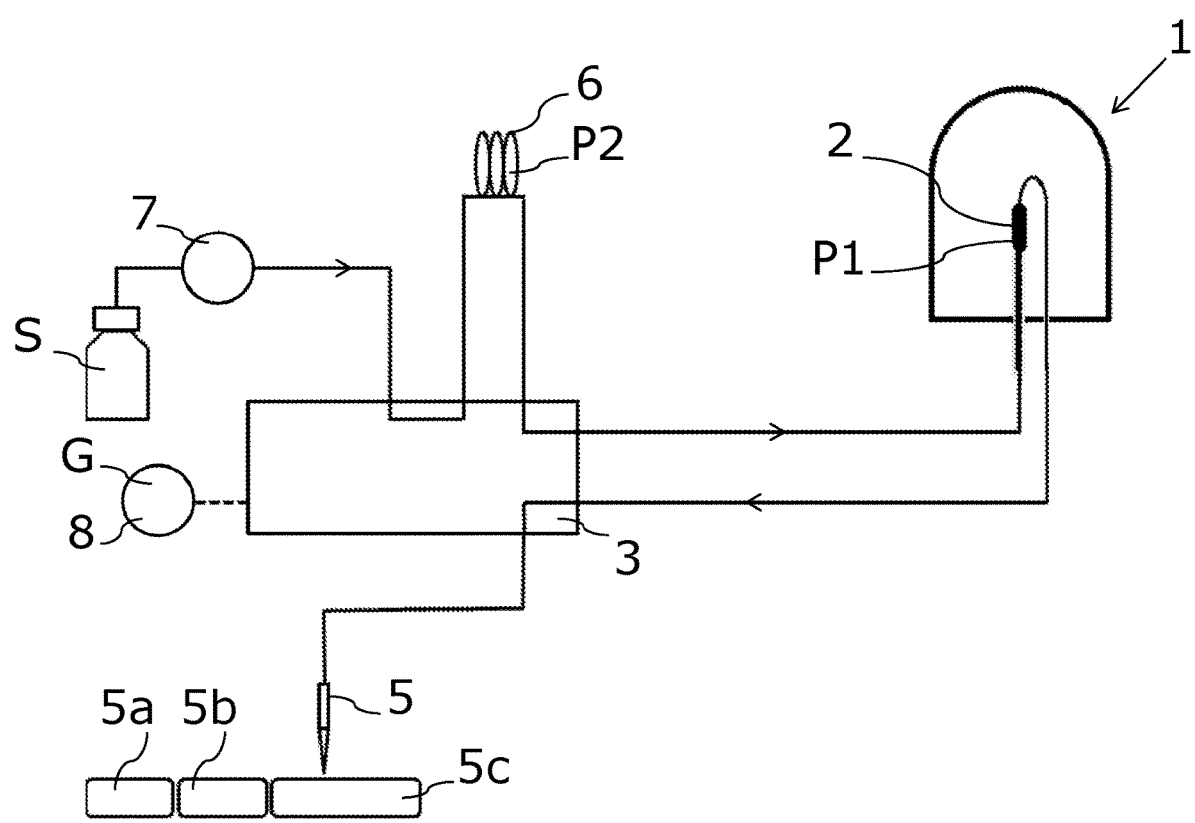
FIG. 1 shows a schematic illustration of a simple embodiment of the system according to the invention during an operational phase for replacing the first liquid test sample in the flow cell of the NMR spectrometer with the second test sample from the sample loop, disposing the first test sample in a receiving vessel and purging the sample loop with a system liquid in the case of a decoupled pressurized gas supply.
Figure 2A:
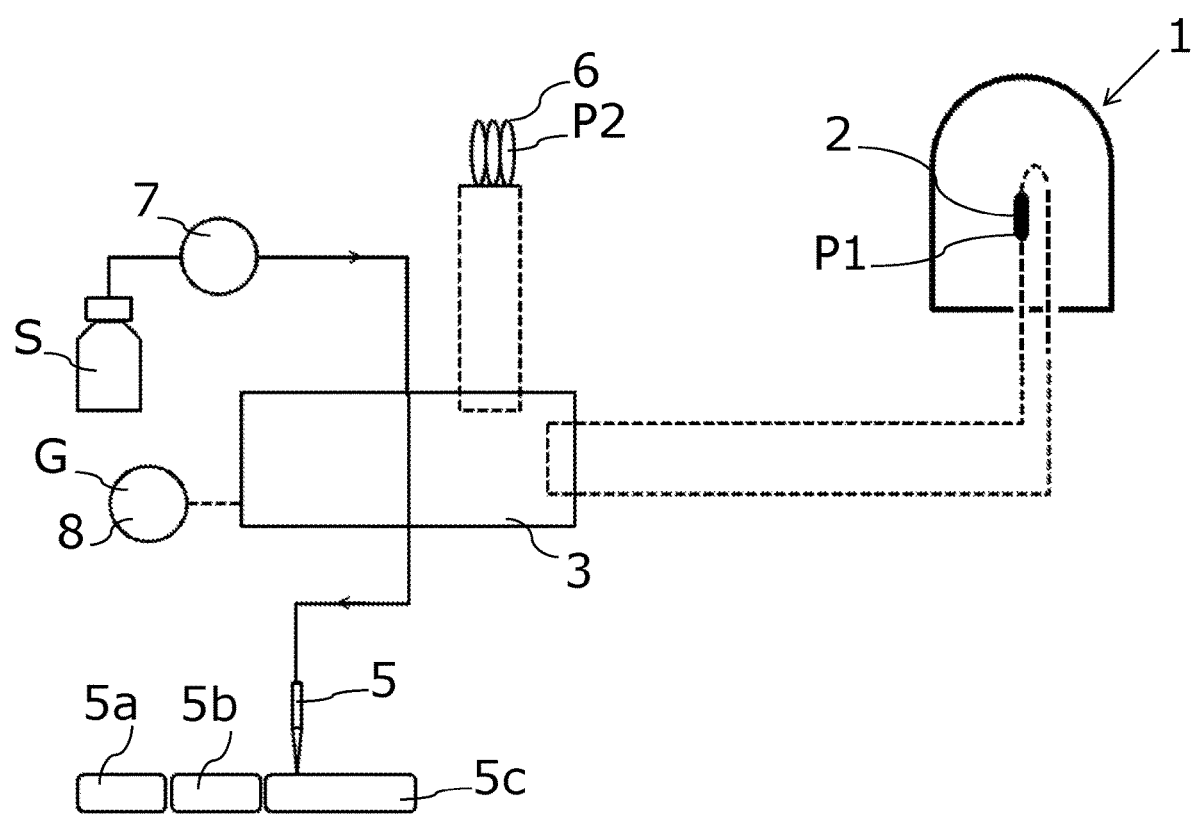
FIG. 2A shows an illustration like FIG. 1, but in an operational phase for washing the cannula with system liquid in the case of a decoupled flow cell, decoupled sample loop and decoupled pressurized gas supply.
Figure 2B:
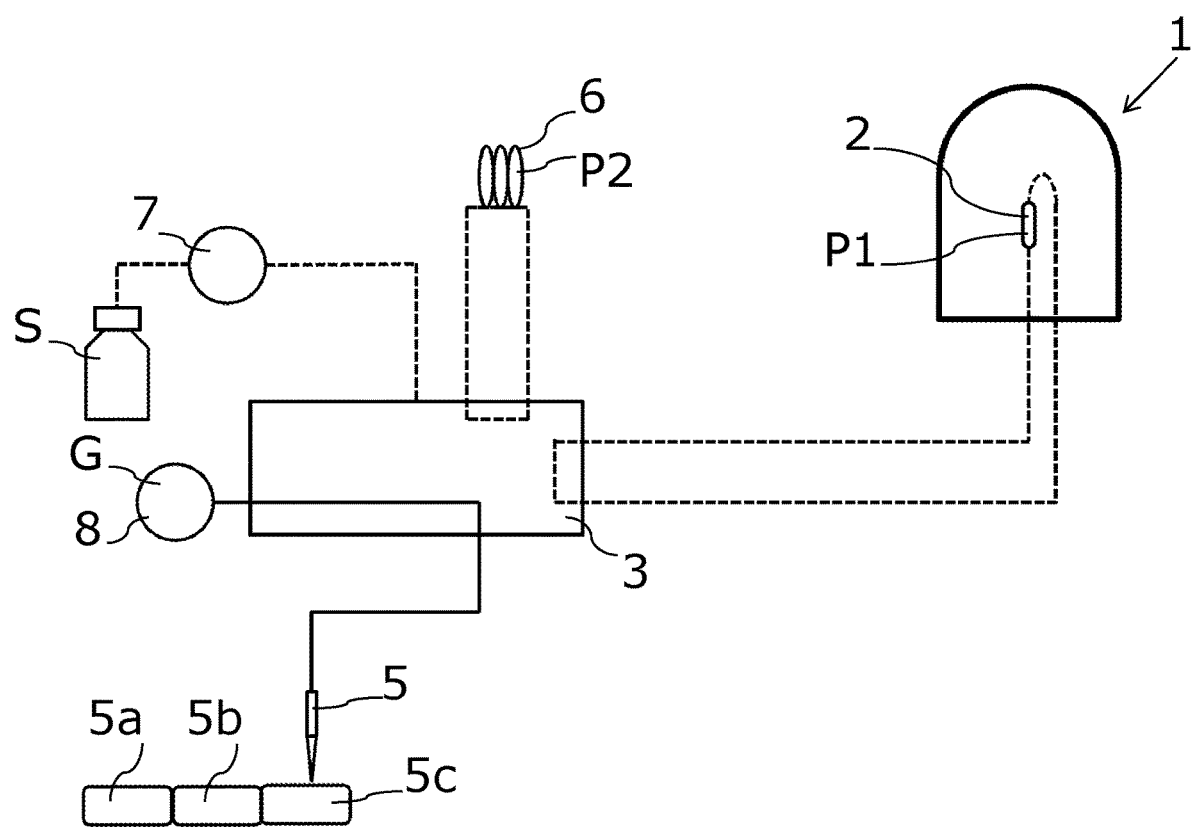
FIG. 2B shows an illustration like FIG. 2A, but in an operational phase for emptying the cannula by blowing using pressurized gas in the case of a decoupled flow cell, decoupled sample loop and decoupled pump device.
Figure 2C:
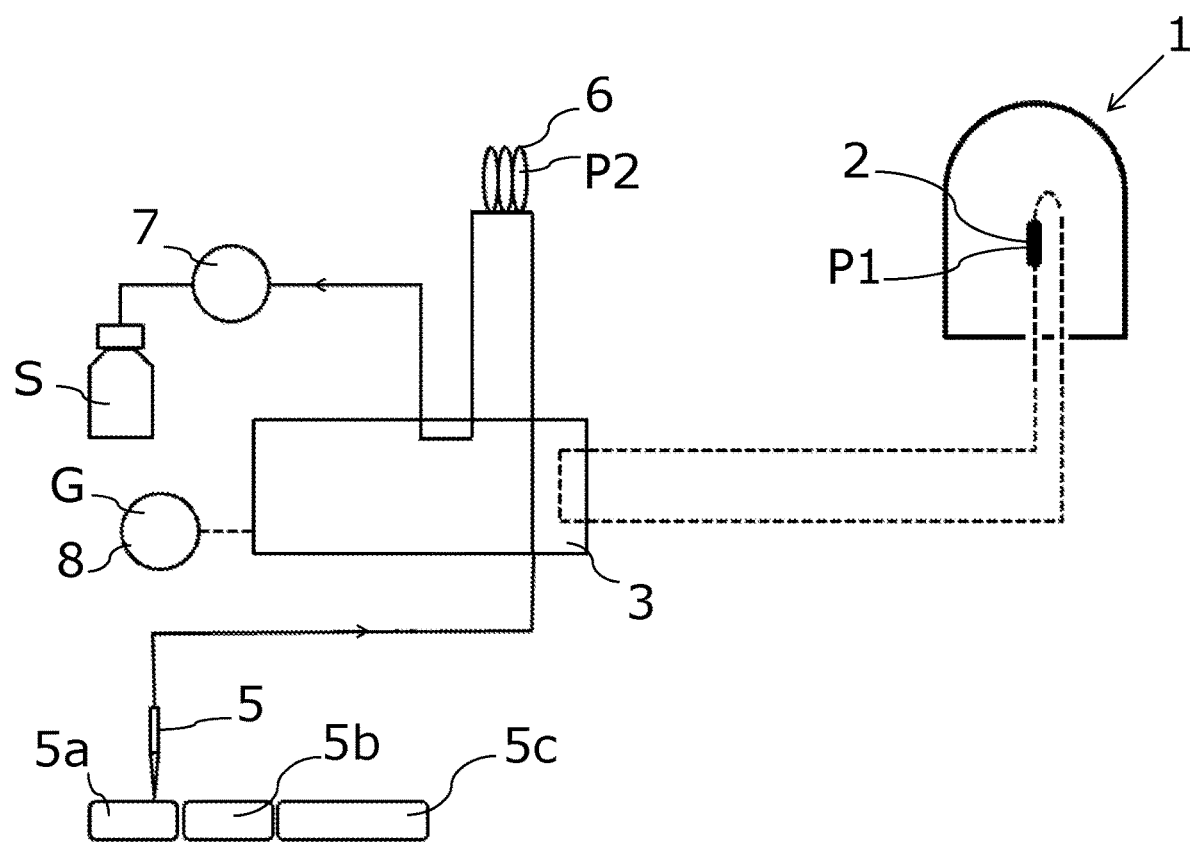
FIG. 2C shows an illustration like FIG. 1, but in an operational phase for aspirating a further liquid test sample from a storage vessel into the sample loop in the case of a decoupled flow cell and decoupled pressurized gas supply.
Figure 2D:
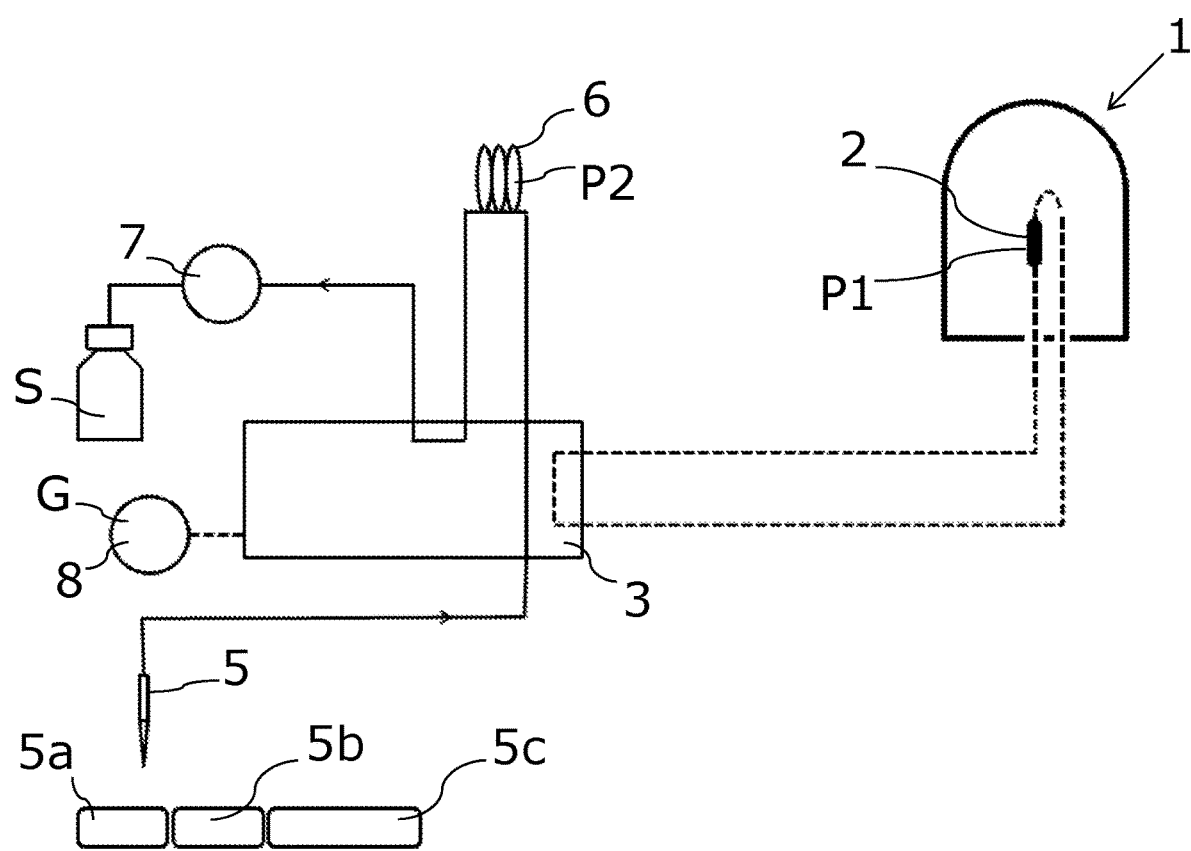
FIG. 2D shows an illustration like FIG. 2C, but with a cannula lifted out of the storage vessel for the purposes of drawing ambient air.
Figure 2E:
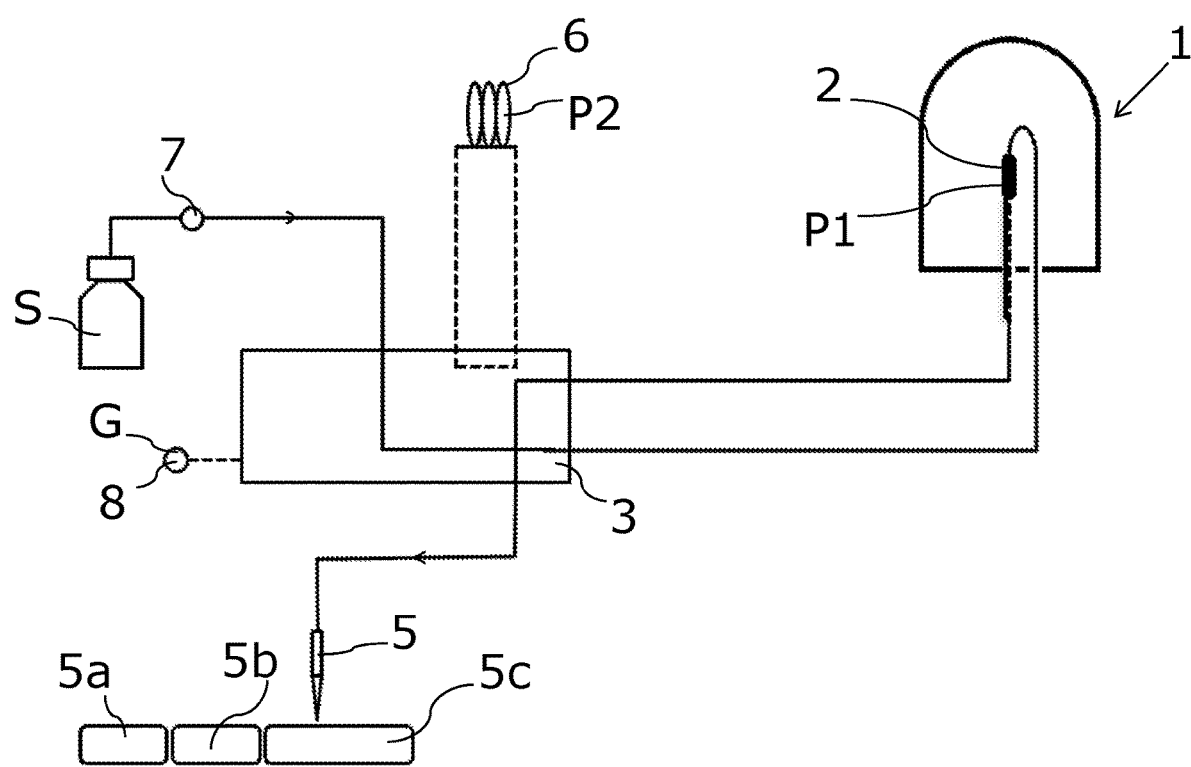
FIG. 2E shows an illustration like FIG. 1, but in an operational phase for washing the first test sample from the flow cell into a disposal vessel using system liquid in the case of a decoupled sample loop and decoupled pressurized gas supply.
Figure 2F:
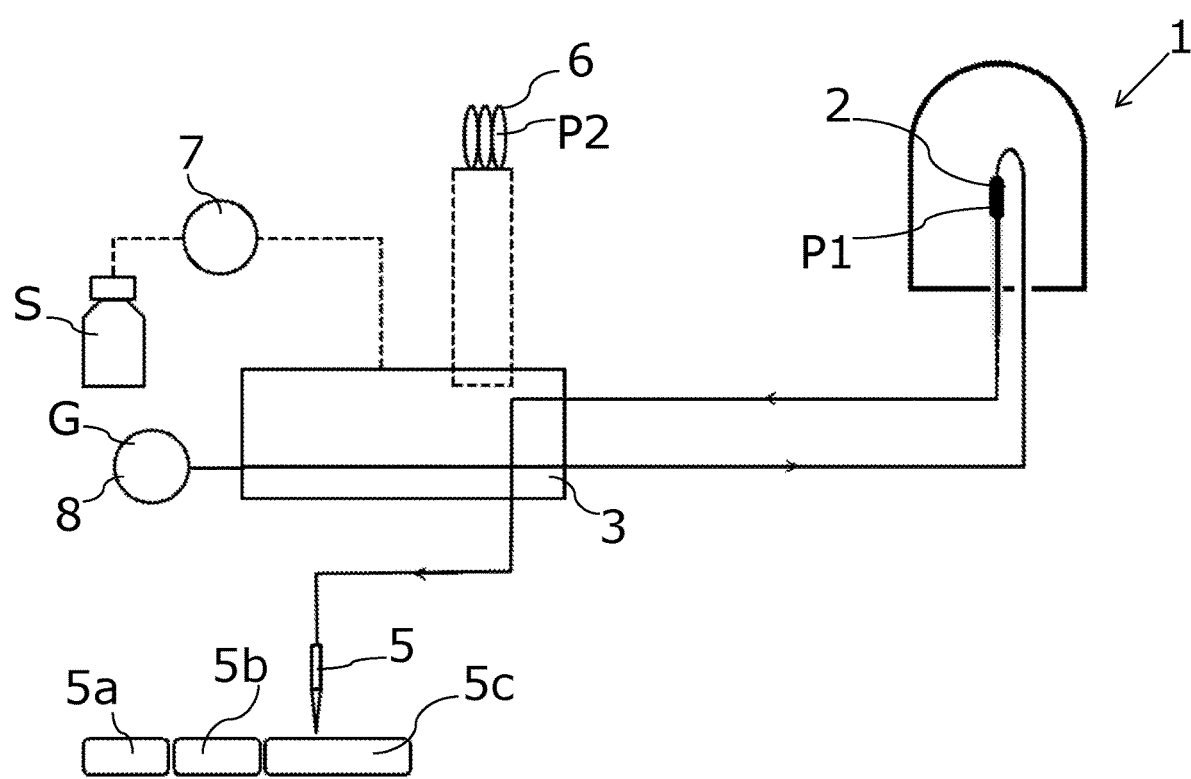
FIG. 2F shows an illustration like in FIG. 1, but in an operational phase for ejecting the first test sample from the flow cell into a receiving vessel by blowing it out using pressurized gas in the case of a decoupled sample loop and decoupled pump device.
Figure 2G:
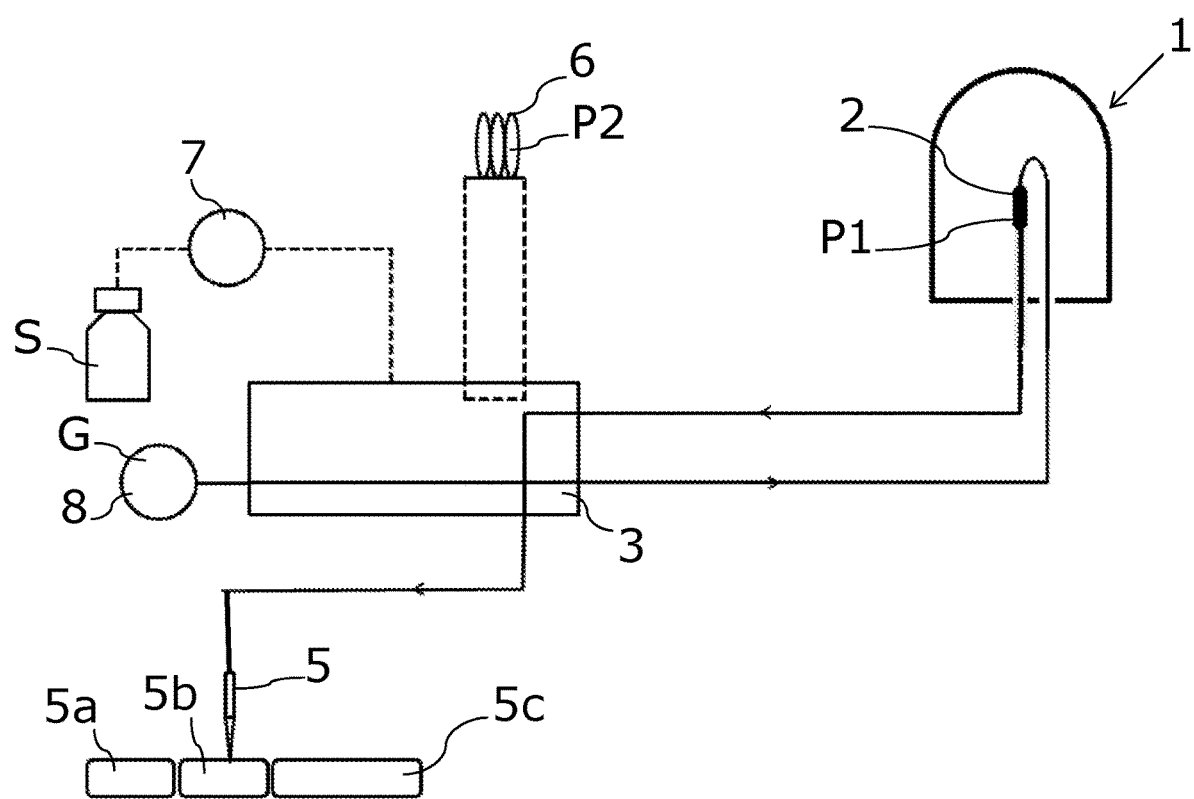
FIG. 2G shows an illustration like in FIG. 2F, but with ejecting, i.e., by blowing out, the first test sample into a receiving vessel, for the purposes of recovering the sample liquid.

The present invention involves the field of magnetic resonance and relates to a novel configuration of a valve arrangement for distributing fluid flows in a distributing device 3 for an NMR spectrometer 1 with a flow cell 2 for carrying out an analytic NMR measurement on a first liquid test sample P1. The valve arrangement comprises at least one multi-way valve 4a, 4b, and a plurality of assemblies, which are connectable to one another in fluid-conducting fashion or separable from one another via fluid lines by way of the distributing device 3. At least the following further assemblies are present in the system: a cannula 5 for taking a liquid test sample from a storage vessel 5a, a sample loop 6 for an intermittent temporary storage of a further liquid test sample P2, and a pump device 7 for pumping system liquid S into the system. As an additional assembly, a pressurized gas supply 8 can also be present for introducing pressurized gas G in the system.

Figure 3:
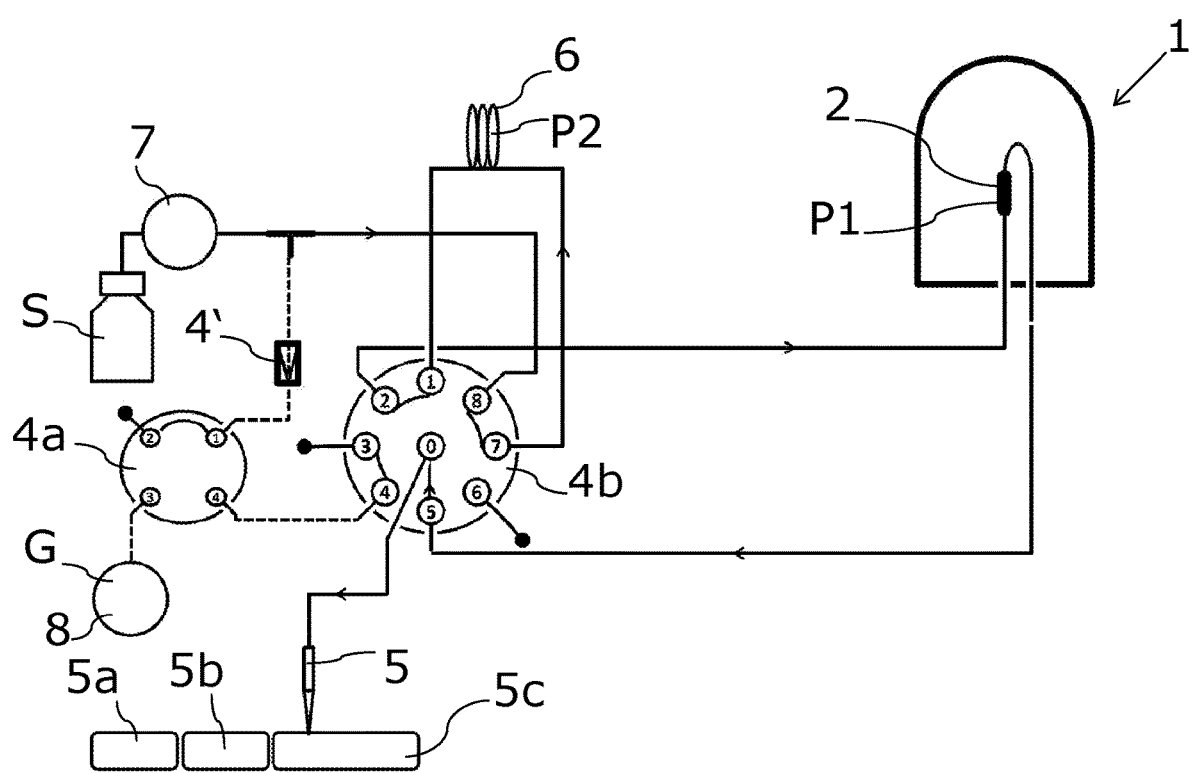
FIG. 3 shows an illustration like FIG. 1 in the same operational phase, but with greater detail and a specific arrangement of multi-way valves in that distributing device.

To provide a more informative illustration, the closed lines not connected to the pump device 7, the cannula 5 or the pressurized gas supply 8, i.e., in particular, lines with a liquid test sample P1 or P2, which are situated in the flow cell 2 or in the sample loop 6, are depicted in dashed form in FIGS. 1 to 3.

The arrangement according to the invention is distinguished in relation to conventional systems according to the prior art by virtue of the fact that the valve arrangement of the distributing device 3 is configured such that a) the sample loop 6 with the temporarily stored further liquid test sample P2 is decouplable from all fluid lines to and from the distributing device 3 and, simultaneously, b) the flow cell 2 with the first liquid test sample P1 is decouplable from all fluid lines from and to the distributing device 3; and c) the cannula 5 is connectable to the pump device 7 for a simultaneous purging step or connectable to the flow cell 2 for removing the first test sample P1 into a receiving vessel 5b; 5c or connectable to the sample loop 6 for receiving a subsequent further test sample P2.

The simple embodiment schematically illustrated in FIG. 1 shows the system according to the invention during an operational phase for replacing the first liquid test sample P1 in the flow cell 2 of the NMR spectrometer 1 with the second test sample P2 from the sample loop 6, disposing of the first test sample P1 in a receiving vessel 5c and purging the sample loop 6 with system liquid S using the pump device 7 in the case of a decoupled pressurized gas supply 8.

The following FIGS. 2A-2G illustrate the further operational phases—already described above—of the system according to FIG. 1.

FIG. 3 shows in greater detail and with a specific arrangement of multi-way valves 4a, 4b in the distributing device 3 an embodiment of the system in the same operational phase as in FIG. 1, for replacing the first liquid test sample P1 in the flow cell 2 using system liquid S in the case of the pressurized gas supply 8 decoupled by a check valve 4'. The distributing device 3 is constructed here from a rotation valve with nine ports and a 4/2-way rotation valve.

Figure 4:
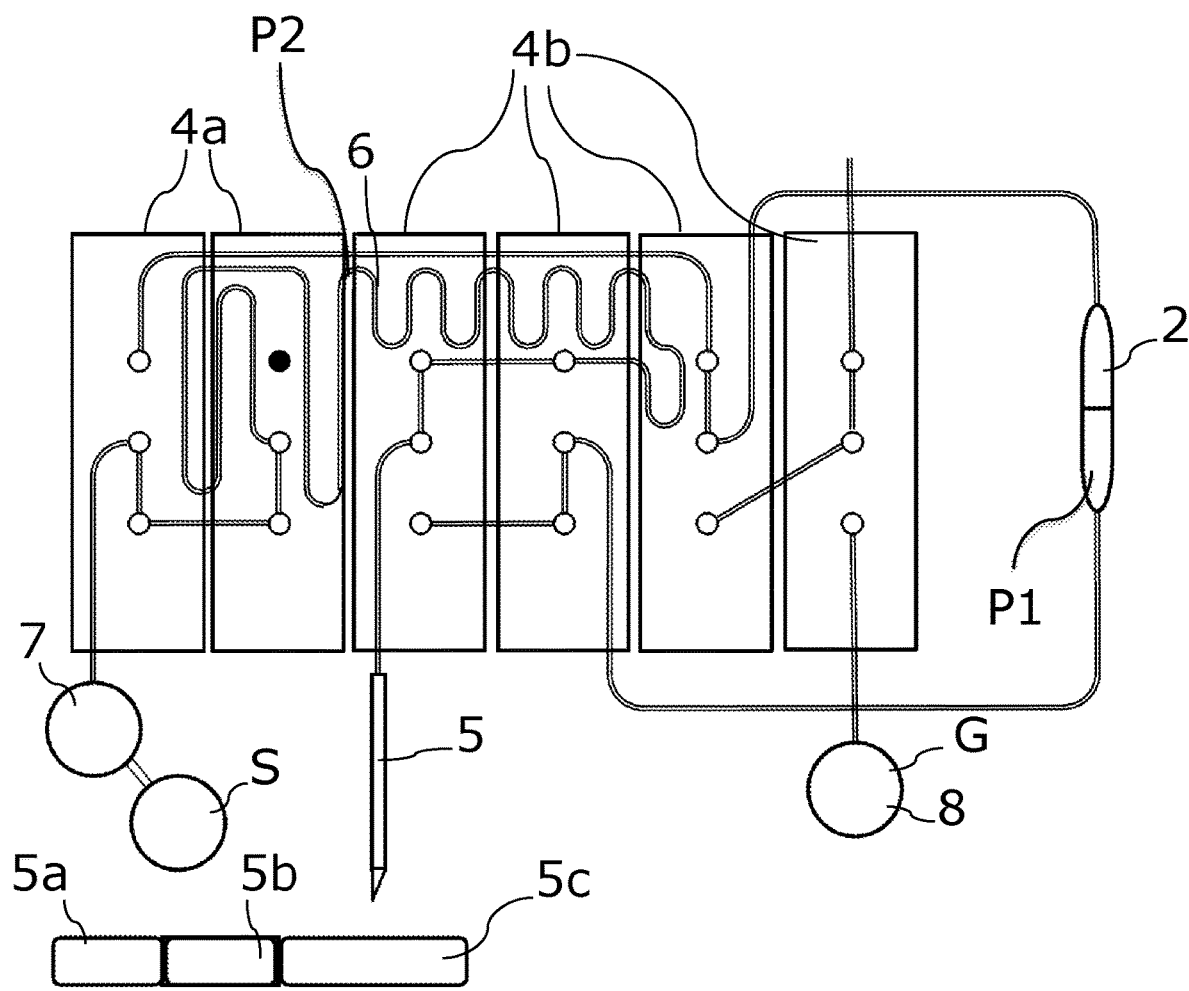
FIG. 4 shows a schematic illustration of a 3/2-way solenoid valve configuration constructed from six standardized individual blocks, for an embodiment of the system according to the invention in an operational phase as in FIG. 2D.

FIG. 4 finally shows a schematic illustration of an embodiment of the system according to the invention with a 3/2-way solenoid valve configuration constructed from six standardized individual blocks as a corresponding manifold. The illustrated operational phase with a cannula lifted out of the receiving vessel 5c for aspirating ambient air via the pump device 7 in the case of a decoupled pressurized gas supply 8 and decoupled flow cell 2 corresponds in terms of its function to the operational phase shown in FIG. 2D.

LIST OF CITATION SYMBOLS

1 NMR spectrometer
2 Flow cell
3 Distributing device
4' Check valve
4a, 4b Multi-way valve
5 Cannula
5a Storage vessel for sample liquid
5b; 5c Receiving vessel for receiving sample liquid again
6 Sample loop
7 Pump device
8 Pressurized gas supply
P1 First liquid test sample
P2 Further liquid test sample
S System liquid
G Pressurized gas

CITATIONS

Documents considered for assessing the patentability:
[1] U.S. Pat. No. 7,250,767 A DE 10 2004 029 632 B4
[2] U.S. Pat. No. 5,397,989 A EP 0 592 816 B1 DE 42 34 544 C2
[3] U.S. Pat. No. 5,705,928 A
[4] U.S. Pat. No. 6,380,737 A
[5] US 2011/0285396 A1

What is claimed is:

1. A system comprising:
a nuclear magnetic resonance (NMR) spectrometer with a flow cell for carrying out an analytic NMR measurement on a first liquid test sample (P1),
a distributing device, which comprises a valve arrangement with at least one multi-way valve, and
a plurality of assemblies which are configured to fluid-conductingly selectively connect to and separate from one another via fluid lines by way of the distributing device, wherein the plurality of assemblies comprises at least:
a cannula for taking a liquid test sample from a storage vessel,
a sample loop for intermittently temporarily storing a further liquid test sample (P2), and
a pump device for pumping system liquid into the system, wherein the valve arrangement of the distributing device is configured
a) to decouple the sample loop with the temporarily stored further liquid test sample (P2) from all of the fluid lines to and from the distributing device and, simultaneously,
b) to decouple the flow cell with the first liquid test sample (P1) from all of the fluid lines from and to the distributing device; and
c) to connect the cannula to the pump device for simultaneously purging the sample loop with the system liquid or to the flow cell for removing the first test sample (P1) into a receiving vessel or to the sample loop for receiving a subsequent further test sample.

2. The system as claimed in claim 1, wherein the pump device is configured to fluid-conductingly connect to one end of the sample loop for conveying the further liquid test sample (P2) temporarily stored in the sample loop into the flow cell of the NMR spectrometer and for purging the sample loop with the system liquid, while a further end of the sample loop is connected to one end of the flow cell.

3. The system as claimed in claim 1, wherein the cannula is configured to fluid-conductingly connect to a receiving vessel for receiving the first liquid test sample (P1) from the flow cell of the NMR spectrometer for recovering or disposing of the first liquid test sample (P1).

4. The system as claimed in claim 1, wherein the plurality of assemblies further comprises a pressurized gas supply for introducing pressurized gas into the system, wherein the pressurized gas supply is configured to fluid-conductingly connect to the flow cell of the NMR spectrometer for blowing out.

5. The system as claimed in claim 4, wherein the valve arrangement of the distributing device is configured to blow out the gas for emptying the flow cell by guiding the gas into the flow cell from above.

6. The system as claimed in claim 2, wherein the pump device is configured to fluid-conductingly connect to one of the two ends of the flow cell for purging the flow cell with the system liquid.

7. The system as claimed in claim 6, wherein the sample loop is configured to completely decouple from the distributing device for purging the flow cell.

8. The system as claimed in claim 1, wherein the valve arrangement of the distributing device is configured to introduce the further liquid test sample (P2) from the sample loop into the flow cell from below.

9. The system as claimed in claim 1, wherein the valve arrangement of the distributing device is configured to introduce the system liquid into the flow cell from above for cleaning.

10. A distributing device for a system as claimed in claim 1, wherein the distributing device comprises a rotation valve with nine ports and one 4/2-way rotation valve.

11. A distributing device for a system as claimed in claim 1, wherein the distributing device comprises six 3/2-way solenoid valves and a corresponding manifold.

12. A method for operating a system as claimed in claim 4, comprising:
(a) decoupling the sample loop with the temporarily stored further liquid test sample (P2) from all fluid lines to and from the distributing device;
(b) fluid-conductingly connecting the pressurized gas supply, for blowing the first liquid test sample (P1) out of the flow cell of the NMR spectrometer, to one end of the flow cell, with a simultaneously decoupled sample loop and decoupled pump device, while simultaneously fluid-conductingly connecting the other end of the flow cell to a receiving vessel for receiving the first liquid test sample (P1), such that the pressurized gas supply blows the first liquid test sample (P1) into the receiving vessel; and
(c) fluid-conductingly connecting the pump device to one end of the flow cell for purging the flow cell with the system liquid, with a simultaneously decoupled sample loop and decoupled pressurized gas supply, while simultaneously fluid-conductingly connecting the other end of the flow cell to a receiving vessel for receiving the system liquid after the purging of the flow cell.

13. The method as claimed in claim 12, wherein, for drying the flow cell and the purged fluid lines following the purging step (c), said method further comprises carrying out a further blowing step (b') wherein the pressurized gas supply is connected to one end of the flow cell for emptying the flow cell by blowing again, with a simultaneously decoupled sample loop and pump device, while the other end of the flow cell is simultaneously fluid-conductingly connected to a receiving vessel for receiving the blown-out fluid.

14. A method for operating a system as claimed in claim 4, further comprising:
  (d) fluid-conductingly connecting the pump device to one end of the sample loop for conveying the further liquid test sample (P2) temporarily stored in the sample loop into the flow cell of the NMR spectrometer and for purging the sample loop with the system liquid, while simultaneously fluid conductingly connecting the other end of the sample loop to one end of the flow cell, and fluid-conductingly connecting the other end of the flow cell to a receiving vessel for receiving the first liquid test sample (P1).

15. The method as claimed in claim 12, wherein the volumetric amount of the further liquid test sample (P2) is measured such that a void volume of the sample loop is only partly filled with the further liquid test sample (P2) and such that the further liquid test sample (P2), when transferred into the flow cell, is taken from that end of the sample loop from which the further liquid test sample was previously filled into the sample loop for temporary storage.

\* \* \* \* \*